(12) United States Patent
Seo

(10) Patent No.: US 7,184,342 B2
(45) Date of Patent: Feb. 27, 2007

(54) SEMICONDUCTOR MEMORY DEVICE HAVING ENHANCED SENSE AMPLIFIER

(75) Inventor: Ju-Young Seo, Ichon-shi (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 0 days.

(21) Appl. No.: 11/020,310

(22) Filed: Dec. 27, 2004

(65) Prior Publication Data

US 2005/0249004 A1 Nov. 10, 2005

(30) Foreign Application Priority Data

May 6, 2004 (KR) ............ 10-2004-0031880

(51) Int. Cl.
*G11C 7/00* (2006.01)
(52) U.S. Cl. .................... 365/203; 365/205
(58) Field of Classification Search ............ 362/203, 362/205; 365/203, 205
See application file for complete search history.

(56) References Cited

U.S. PATENT DOCUMENTS

| | | | |
|---|---|---|---|
| 6,480,425 B2* | 11/2002 | Yanagisawa et al. | .. 365/189.05 |
| 6,566,929 B2* | 5/2003 | Pyo | ............ 327/296 |
| 6,778,460 B1 | 8/2004 | Jung | |
| 6,853,593 B1 | 2/2005 | Bae | |
| 7,042,781 B2* | 5/2006 | Kim | ............ 365/205 |
| 2004/0213063 A1 | 10/2004 | Park | |

FOREIGN PATENT DOCUMENTS

KR  10-0540484  12/2005

* cited by examiner

*Primary Examiner*—Hoai V. Ho
(74) *Attorney, Agent, or Firm*—McDermott Will & Emery LLP

(57) ABSTRACT

Disclosed is a semiconductor memory device with a reduced write recovery time and an increased refresh period. The semiconductor memory device incorporating a plurality of memory cells therein, including: a bit line sense amplifier (BLSA) array provided with a plurality of bit line sense amplifiers for sensing and amplifying data of the memory cells applied to bit lines; and a BLSA driving control means for overdriving a bit line connected to the bit line sense amplifier in response to an active command, and for overdriving the bit line in response to a precharge command.

19 Claims, 6 Drawing Sheets

SEMICONDUCTOR MEMORY DEVICE HAVING ENHANCED SENSE AMPLIFIER

FIELD OF INVENTION

The present invention relates to a semiconductor memory device; and, more particularly, to a semiconductor memory device capable of reducing a write recovery time and increasing a self refresh period, and a driving method thereof.

DESCRIPTION OF PRIOR ART

As a modern semiconductor memory device requires a low operational voltage for reducing power consumption, various techniques have been developed to improve an operation of a sense amplifier, of which one is to apply an overdriving scheme of the sense amplifier to the semiconductor memory device.

Conventionally, a row address activates a predetermined word line connected to a plurality of memory cells arranged in a same row and then, a data stored in the memory cells are transferred to a bit line. A bit line sense amplifier senses a potential difference of a bit line pair and amplifies the data transferred to the bit line.

During the above operation, since thousands of bit line sense amplifiers start operating simultaneously, an operational time of the bit line sense amplifier is determined according as current can be sufficiently supplied to drive the bit line sense amplifier. However, it is difficult to supply sufficient current at once because the modern semiconductor memory device requires a low operation voltage. To overcome the above problem, a high voltage is instantaneously supplied to a bit line sense amplifier (BLSA) power line RTO at an initial operation stage so that a voltage level of a normal voltage, i.e., an internal core voltage, is increased. This is so called the overdriving scheme of the bit line sense amplifier. Herein, the initial operation stage is referred to a moment soon after charges are shared with the memory cell and the bit line.

FIG. 1 is a block diagram setting forth a conventional semiconductor memory device.

Referring to FIG. 1, the conventional semiconductor memory device includes an internal signal generator 10, a BLSA driving control signal generator 20, a BLSA power line driver 30, a BLSA array 40 and a memory cell array 50. Herein, the BLSA array 40 provided with a plurality of bit line sense amplifiers that sense a potential difference of a bit line pair BL and BLB and amplifies the data transferred to the bit line. The BLSA power line driver 30 applies an operation voltage to BLSA power lines RTO and SZ. The internal signal generator 10 generates a predetermined enable signal SAEN by receiving external commands such as an active command ACT and a precharge command PCG. The BLSA driving control signal generator 20 is controlled by the internal signal generator 10 and generates control signals SP1B, SP2B and SN to control the BLSA power line driver 30.

FIG. 2 is a timing diagram setting forth an operational sequence of the conventional semiconductor memory device.

To begin with, in case that the active command ACT is activated, data stored in the memory cell is applied to the bit line pair BL and BLB. The internal signal generator 10 activates the predetermined enable signal SAEN in response to the external commands ACT and PCG. The BLSA driving control signal generator 20 activates an overdriving control signal SP1B for a predetermined time in response to the predetermined enable signal SAEN so that an external voltage VEXT is applied to the BLSA power line RTO. Therefore, the data of the memory cell applied to the bit line pair BL and BLB is more rapidly sensed and amplified at the bit line sense amplifier.

Thereafter, in case that a voltage level of the bit line pair BL and BLB becomes beyond a specific voltage level, the BLSA driving control signal generator 20 deactivates the overdriving control signal SP1B and simultaneously activates a normal driving control signal SP2B. Thus, a core voltage VCORE is applied to the BLSA power line RTO. Afterwards, though it is not shown in FIG. 2, a read or a write operation is performed sequentially. Then, when a precharge command PCG is activated, the internal signal generator 10 deactivates the predetermined enable signal SAEN and the BLSA driving control signal generator 20 deactivates the normal driving control signal SP2B in response to the deactivated predetermined enable signal SAEN.

For reference, the BLSA driving control signal generator 20 activates a normal voltage driving signal SN for applying a ground voltage VSS to the BLSA power line SZ, in response to the predetermined enable signal SAEN.

Meanwhile, according to the conventional semiconductor memory device, when the external voltage VEXT is unstable, the write recovery time in the memory cell becomes longer and further, it is required frequent refreshes due to degradation of a data-voltage level. For example, as the voltage level of the external voltage VEXT is lower and lower, the voltage level of the core voltage VCORE generated on the basis of the external voltage VEXT also becomes lower. Therefore, the voltage level of the BLSA power line RTO is reduced so that the data of the memory cell cannot help but be stored as a low voltage level. Accordingly, it is necessary to perform the frequent refresh operation for retention of the data.

In addition, if a write command is applied, a data that will be written to the memory cell is over-written to the bit line that existing data of the memory cell has been applied thereto. Thus, as the external voltage VEXT becomes low, a write recovery time is elongated so that there is a limitation for device operation. Herein, the write recovery time refers to the time period that the writing data is over-written to the bit line pair and then, the voltage level of the bit line pair is inverted and amplified.

The above problem, as aforementioned, is caused by the unstable voltage level of the external voltage VEXT or by a manufacturing process for a highly-integrated memory device. That is, as the semiconductor memory device is highly integrated nowadays, a size of a cell access transistor is reduced. Therefore, it is difficult to carry out a process for forming a plurality of contacts in the device. As a result, provided that the contacts are formed agley in the highly-integrated device, an operational range of the core voltage VCORE becomes low.

As described above, the conventional semiconductor memory device has a disadvantage that if the operational range of the core voltage VCORE becomes low due to the low external voltage VEXT or the problem of the manufacturing process, the write recovery time is elongated to cause the limitation for the device operation. Furthermore, it is necessary to perform the frequent refresh operation after all in the conventional semiconductor memory device.

SUMMARY OF INVENTION

It is, therefore, an object of the present invention to provide a semiconductor memory device capable of reducing a write recovery time and increasing a refresh period.

It is, therefore, another object of the present invention to provide a driving method of a semiconductor memory device capable of reducing a write recovery time and increasing a refresh period.

In accordance with an aspect of the present invention, there is provided a semiconductor memory device incorporating a plurality of memory cells therein, including: a bit line sense amplifier (BLSA) array provided with a plurality of bit line sense amplifiers for sensing and amplifying data of the memory cells applied to bit lines; and a BLSA driving control means for overdriving a bit line connected to the bit line sense amplifier in response to an active command, and for overdriving the bit line in response to a precharge command.

In accordance with another aspect of the present invention, there is provided a driving method of a semiconductor memory device, including the steps of: a) driving a bit line for a first predetermined time with an overdriving voltage in response to an active command; b) driving the bit line with a normal voltage after the step a); and c) driving the bit line for a second predetermined time with the overdriving voltage in response to a precharge command.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawing.

Figure 1:
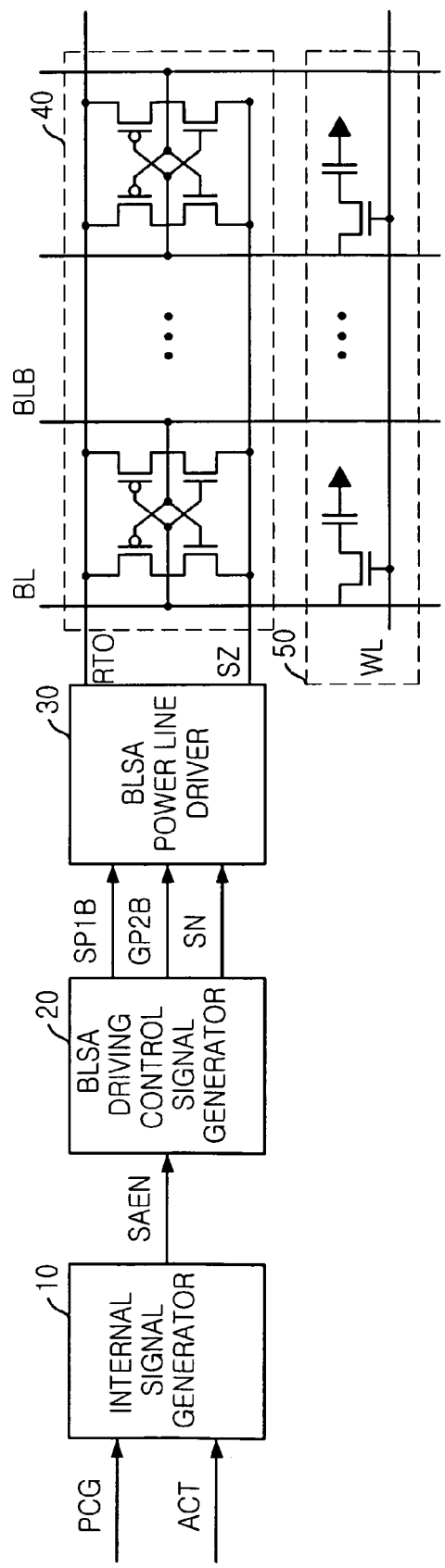
FIG. 1 is a block diagram setting forth a conventional semiconductor memory device.
Figure 2:
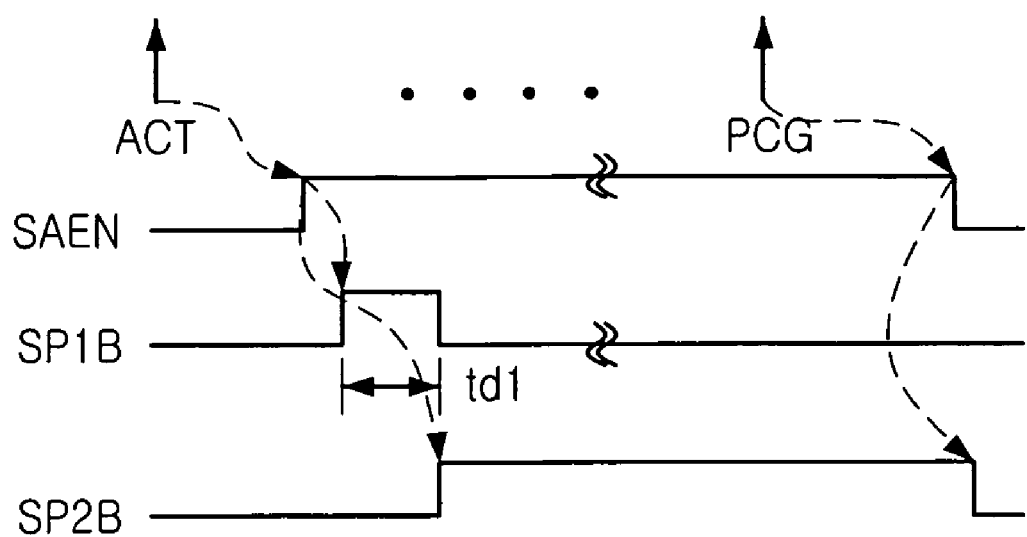
FIG. 2 is a timing diagram explaining an operational sequence of the conventional semiconductor memory device.
Figure 3:
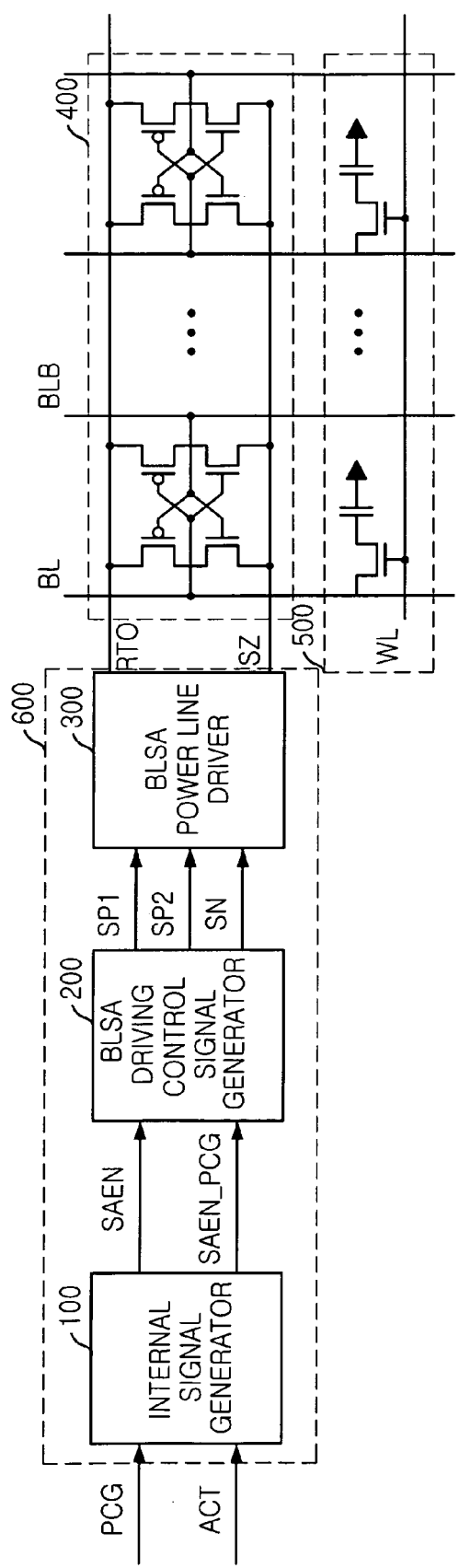
FIG. 3 is a block diagram illustrating a semiconductor memory device in accordance with a preferred embodiment of the present invention.

FIG. 3 is a block diagram setting forth a semiconductor memory device in accordance with a preferred embodiment of the present invention.

Referring to FIG. 3, the semiconductor memory device of the present invention includes a bit line sense amplifier (BLSA) driving controller 600, a BLSA array 400 and a memory cell array 500. Furthermore, the BLSA driving controller 600 is provided with an internal signal generator 100, a BLSA driving control signal generator 200 and a BLSA power line driver 300.

Herein, the BLSA driving controller 600 is employed for overdriving a bit line connected to the bit line sense amplifier in response to an active command ACT, and for overdriving the bit line in response to a precharge command PCG. In detail, the BLSA array 400 incorporating therein a plurality of bit line sense amplifiers that sense a potential difference of a bit line pair BL, BLB and amplifies the data transferred to the bit line. The internal signal generator 100 generates a first enable signal SAEN and a second enable signal SAEN_PCG in response to an active command ACT and a precharge command PCG, wherein the first enable signal SAEN has an activation period corresponding to a row active time tRAS and the second enable signal SAEN_PCG has an activation period which is slightly shorter than the row active time tRAS by a predetermined time in comparison with the activation time of the first enable signal SAEN. The BLSA power line driver 300 is used for normally driving or overdriving the BLSA power line RTO. The BLSA driving control signal generator 200 generates a plurality of control signals SP1, SP2, SN to control the BLSA power line driver 300 in response to the first enable signal SAEN and the second enable signal SAEN_PCG.

Figure 4:
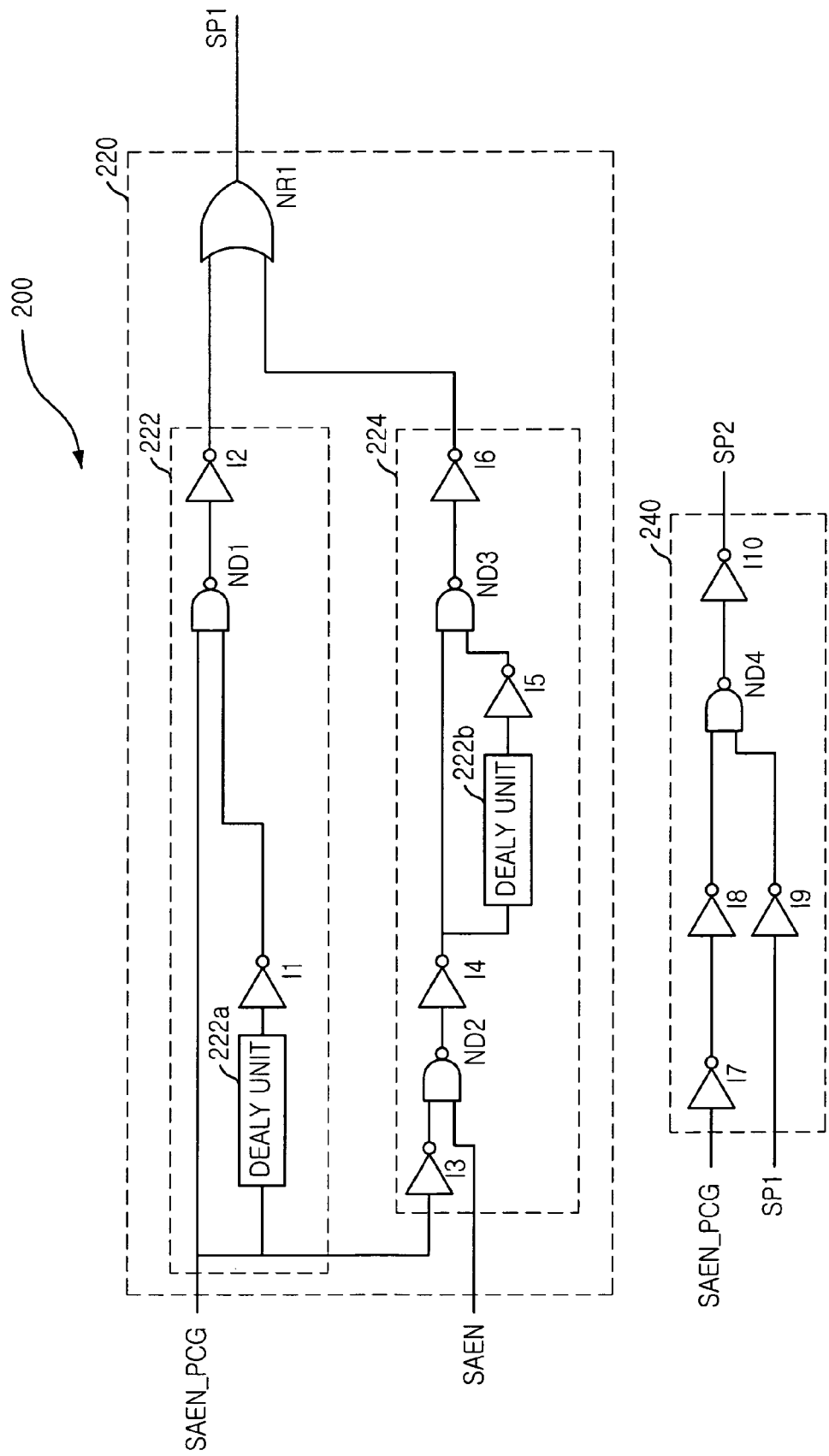
FIG. 4 is a circuit diagram representing a bit line sense amplifier (BLSA) driving control signal generator of the semiconductor memory device in accordance with the present invention.

FIG. 4 is a circuit diagram setting forth the BLSA driving control signal generator 200 of the BLSA driving controller 600 in accordance with the preferred embodiment of the present invention.

Referring to FIG. 4, the BLSA driving control signal generator 200 includes an overdriving control signal generator 220 and a normal driving control signal generator 240. The overdriving control signal generator 220 activates an overdriving control signal SP1 during a first predetermined time td1 when the first enable signal SAEN is activated, and also activates the overdriving control signal SP1 during a second predetermined time td2 when the second enable signal SAEN_PCG is deactivated. The normal driving control signal generator 240 activates a normal driving control signal SP2 when the first enable signal SAEN is activated and the overdriving control signal SP1 is deactivated.

Meanwhile, the overdriving control signal generator 220 is provided with an initial overdriving unit 222, a terminal overdriving unit 224 and a NOR gate NR1 for performing a logic NOR operation to the output signals of the initial overdriving unit 222 and the terminal overdriving unit 224, in order to output the overdriving control signal SP1. Herein, the initial overdriving unit 222 has a first delay unit 222A for delaying the second enable signal SAEN_PCG by the first predetermined time td1, a first inverter I1 for inverting the output signal of the first delay unit 222A, a first NAND gate ND1 for performing a logic NAND operation to the second enable signal SAEN_PCG and the output signal of the first inverter I1, a second inverter I2 for inverting the output signal of the first NAND gate ND1. Therefore, the initial overdriving unit 222 activates the overdriving control signal SP1 for the first predetermined time td1 when the second enable signal SAEN_PCG is activated.

In addition, the terminal overdriving unit 224 has a third inverter I3 for inverting the second enable signal SAEN_PCG, a second NAND gate ND2 for performing a logic NAND operation to the output signal of the third inverter I3 and the first enable signal SAEN, a fourth inverter I4 for inverting the output signal of the second NAND gate ND2, a second delay unit 222B for delaying the output signal of the fourth inverter I4 by the second predetermined time td2, a third NAND gate ND3 for performing a logic NAND operation to the output signals of the third and the fourth inverters I3 and I4, and a sixth inverter I6 for inverting the output signal of the third NAND gate ND3. Thus, the terminal overdriving unit 224 activates the overdriving control signal SP1 for the second predetermined time td2 when the second enable signal SAEN_PCG is deactivated and the first enable signal SAEN is activated.

The normal driving control signal generator 240 is provided with a seventh and eighth inverters I7 and I8 for delaying the second enable signal SAEN_PCG, a ninth inverter I9 for inverting the overdriving control signal SP1, a fourth NAND gate for performing a logic NAND operation to the output signals of the eighth and ninth inverters I8 and I9, and a tenth inverter I10 for outputting the normal driving control signal SP2 by inverting the output signal of the fourth NAND gate ND4.

Figure 5:
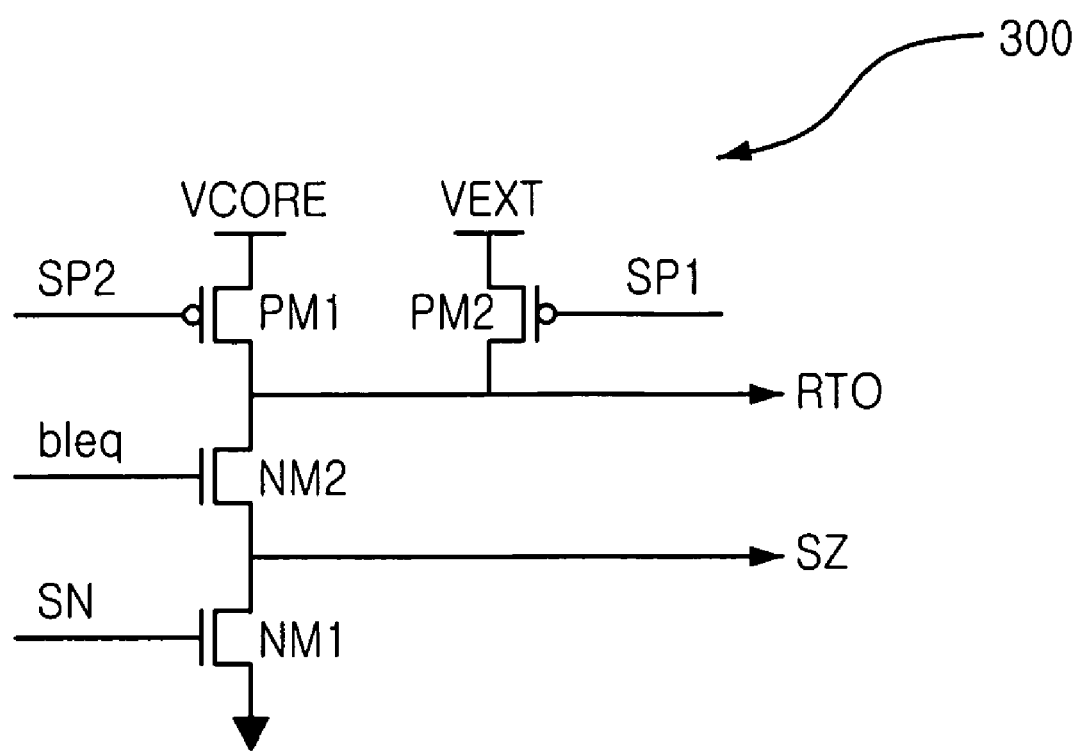
FIG. 5 is a circuit diagram depicting a BLSA power line driver of the semiconductor memory device in accordance with the present invention.

FIG. 5 is a circuit diagram setting forth the BLSA power line driver 300 of the BLSA driving controller 600 in accordance with the preferred embodiment of the present invention.

Referring to FIG. 5, the BLSA power line driver 300 includes a first PMOS transistor PM1 for applying the core voltage VCORE to the BLSA power line RTO in response to the normal driving control signal SP2, a second PMOS transistor PM2 for applying the external voltage VEXT to the BLSA power line RTO in response to the overdriving control signal SP1, a first NMOS transistor NM1 for applying the ground voltage VSS to the BLSA power line SZ in response to the normal voltage driving signal SN, and a second NMOS transistor for rendering the BLSA power lines RTO and SZ be a same voltage level in response to an equalizing signal bleq. In general, the external voltage VEXT has a higher voltage level than the core voltage VCORE.

Figure 6:
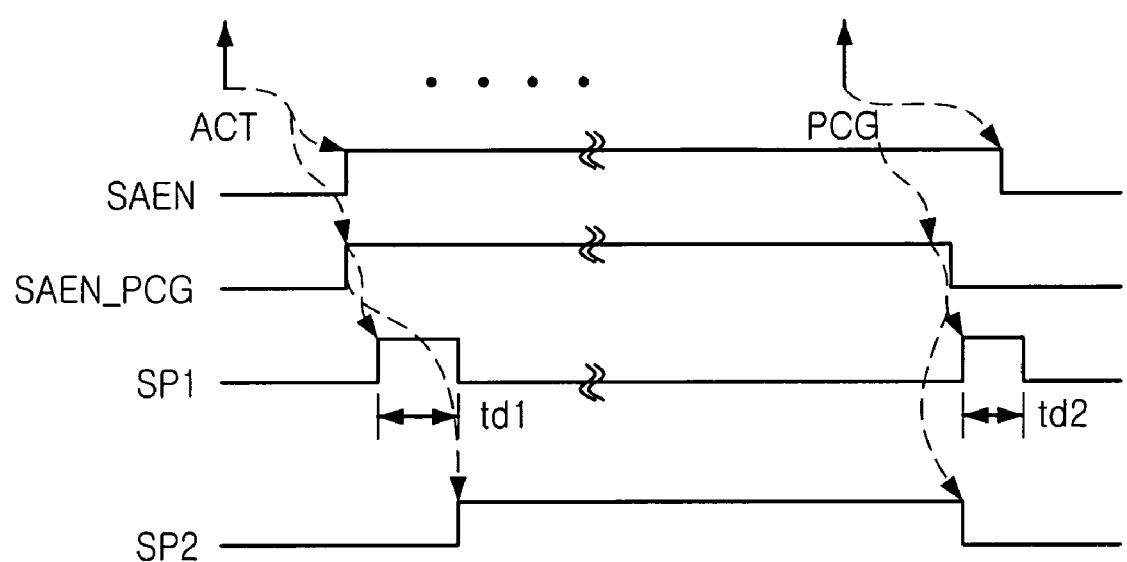
FIG. 6 is a timing diagram showing an operational sequence of the semiconductor memory device in accordance with the present invention.

FIG. 6 is a timing diagram setting forth an operational sequence of the semiconductor memory device in accordance with the preferred embodiment of the present invention.

To begin with, when the active command ACT is activated, data stored in the memory cells are applied to the bit line pair BL, BLB. Then, the internal signal generator 100 activates the first enable signal SAEN and the second enable signal SAEN_PCG in response to the active command ACT. The BLSA driving control signal generator 200 activates the overdriving control signal SP1 for the first predetermined time td1 when the second enable signal SAEN_PCG is activated so that the external voltage VEXT is applied to the BLSA power line RTO. Therefore, the data applied to the bit line is rapidly sensed and amplified at the bit line sense amplifier.

Afterwards, in case that a voltage level of the bit line pair BL and BLB becomes beyond a specific voltage level, the BLSA driving control signal generator 200 deactivates the overdriving control signal SP1 and activates the normal driving control signal SP2. Thereafter, when the precharge command is activated, the internal signal generator 100 deactivates the second enable signal SAEN_PCG. In response to the activated second enable signal SAEN_PCG, the BLSA driving control signal generator 200 deactivates the normal driving control signal SP2 and activates the overdriving control signal SP1 for the second predetermined time td2. Accordingly, since the external voltage VEXT is applied to the bit line pair BL, BLB just before the word line is deactivated due to the precharge command PCG, the voltage level is rapidly increased to thereby store the data in the memory cell with high speed.

Thereafter, the BLSA driving control signal generator 200 deactivates the first enable signal SAEN and deactivates the word line so that the data of the bit line pair is stored in the memory cell.

As described above, the present invention provides an advantageous merit for reducing the write recovery time. In other words, the external voltage VEXT of which voltage level is higher than the core voltage VCORE is applied to the BLSA power line RTO just before performing a precharge operation even though the operational range of the core voltage VCORE becomes lowered because of the low external voltage level. Accordingly, it is possible to reduce the write recovery time. Furthermore, in comparison with the conventional semiconductor memory device, since the voltage level of the memory cell is relatively higher than the prior art, the self refresh period can be increased.

The present application contains subject matter related to the Korean patent application No. KR 2004-31880, filled in the Korean Patent Office on May 6, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device incorporating a plurality of memory cells therein, comprising:
  a bit line sense amplifier (BLSA) array provided with a plurality of bit line sense amplifiers for sensing and amplifying data of the memory cells; and
  a BLSA driving control means for overdriving a bit line connected to the bit line sense amplifier in response to an active command, and for overdriving the bit line in response to a precharge command,
  wherein the BLSA driving control means includes:
  an internal signal generator for generating a first enable signal with an activation period corresponding to a row active time and a second enable signal with an activation period which is shorter than the row active time, in response to the active command and the precharge command;
  a BLSA power line driver for driving BLSA power lines with a normal voltage or overdriving the BLSA power lines; and
  a driving control signal generator for generating a driving control signal for controlling the BLSA power line driver in response to the first and the second enable signals.

2. The semiconductor memory device as recited in claim 1, wherein the driving control signal generator includes:
  an overdriving control signal generator for activating an overdriving control signal for a first predetermined time in response to an activated first enable signal and activating the overdriving control signal for a second predetermined time in response to a deactivated second enable signal; and
  a normal driving control signal generator for activating a normal driving control signal while the first enable signal is activated and the overdriving control signal is deactivated.

3. The semiconductor memory device as recited in claim 2, wherein the overdriving control signal generator includes:
  a first overdriving unit for activating the overdriving control signal during the first predetermined time when the second enable signal is activated;

a second overdriving unit for activating the overdriving control signal during the predetermined time when the second enable signal is deactivated and the first enable signal is activated; and a logic circuit for combining the output signals of the first overdriving unit and the second overdriving unit to output the overdriving control signal.

4. The semiconductor memory device as recited in claim 3, wherein the first overdriving unit includes:
a first delay unit for delaying the second enable signal by the first predetermined time;
a first inverter for inverting the output signal of the first delay unit;
a first NAND gate for performing a logic NAND operation to the second enable signal and the output signal of the first inverter; and
a second inverter for inverting the output signal of the first NAND gate.

5. The semiconductor memory device as recited in claim 3, wherein the second overdriving unit includes:
a third inverter for inverting the second enable signal;
a second NAND gate for performing a logic NAND operation to the first enable signal and the output signal of the third inverter;
a fourth inverter for inverting the output signal of the second NAND gate;
a second delay unit for delaying the output signal of the fourth inverter by the second predetermined time;
a fifth inverter for inverting the output signal of the second delay unit;
a third NAND gate for performing a logic NAND operation to the output signal of the fourth inverter and the output signal of the fifth inverter; and
a sixth inverter for inverting the output signal of the third NAND gate.

6. The semiconductor memory device as recited in claim 3, wherein the logic circuit is a NOR gate.

7. The semiconductor memory device as recited in claim 2, wherein the normal driving control signal generator includes:
a seventh and an eighth inverters for delaying the second enable signal;
a ninth inverter for inverting the overdriving control signal;
a fourth NAND gate for performing a logic NAND operation to the output signal of the eighth inverter and the output signal of the ninth inverter; and
a tenth inverter for outputting the normal driving control signal by inverting the output signal of the fourth NAND gate.

8. The semiconductor memory device as recited in claim 1, wherein the BLSA power line driver includes:
a first PMOS transistor for driving a core voltage to a BLSA power line in response to a normal driving control signal;
a second PMOS transistor for driving an external voltage to the BLSA power line in response to an overdriving control signal;
a first NMOS transistor for driving a ground voltage to another BLSA power line in response to a normal voltage driving signal; and
a second NMOS transistor for keeping the BLSA power lines be in a same voltage level in response to an equalizing signal.

9. A driving method of a semiconductor memory device, comprising the steps of:

a) driving a bit line for a first predetermined time with an overdriving voltage based on a first enable signal activated in response to an active command;
b) driving the bit line with a normal voltage after the step a); and
c) driving the bit line for a second predetermined time with the overdriving voltage based on a second enable signal inactivated in response to a precharge command.

10. A semiconductor memory device incorporating a plurality of memory cells therein, comprising:
a bit line sense amplifier (BLSA) array provided with a plurality of bit line sense amplifiers for sensing and amplifying data of the memory cells; and
a BLSA driving control means for controlling a bit line connected to the bit line sense amplifier by using first and second enable signals, each having different activation period in response to an active command and a precharge command; wherein
said bit line is overdriven for a first predetermined time in response to an activated first enable signal and a second predetermined time in response to a deactivated second enable signal.

11. The semiconductor memory device as recited in claim 10, wherein the BLSA driving control means includes:
an internal signal generator for generating the first enable signal with an activation period corresponding to a row active time and the second enable signal with an activation period which is shorter than the row active time, in response to the active command and the precharge command;
a BLSA power line driver for driving BLSA power lines with a normal voltage or overdriving the BLSA power lines; and
a driving control signal generator for generating a driving control signal for controlling the BLSA power line driver in response to the first and the second enable signals.

12. The semiconductor memory device as recited in claim 11, wherein the driving control signal generator includes:
an overdriving control signal generator for activating an overdriving control signal for said first predetermined time in response to said activated first enable signal and activating the overdriving control signal for a second predetermined time in response to said deactivated second enable signal; and
a normal driving control signal generator for activating a normal driving control signal while the first enable signal is activated and the overdriving control signal is deactivated.

13. The semiconductor memory device as recited in claim 12, wherein the overdriving control signal generator includes:
a first overdriving unit for activating the overdriving control signal during the first predetermined time when the second enable signal is activated;
a second overdriving unit for activating the overdriving control signal during the second predetermined time when the second enable signal is deactivated and the first enable signal is activated; and
a logic circuit for combining the output signals of the first overdriving unit and the second overdriving unit to output the overdriving control signal.

14. The semiconductor memory device as recited in claim 13, wherein the first overdriving unit includes:
a first delay unit for delaying the second enable signal by the first predetermined time;

a first inverter for inverting the output signal of first delay unit;

a first NAND gate for performing a logic NAND operation to the second enable signal and the output signal of the first inverter; and a second inverter for inverting the output signal of the first NAND gate.

15. The semiconductor memory device as recited in claim 13, wherein the second overdriving unit includes:

a third inverter for inverting the second enable signal;

a second NAND gate for performing a logic NAND operation to the first enable signal and the output signal of the third inverter;

a fourth inverter for inverting the output signal of the second NAND gate;

a second delay unit for delaying the output signal of the fourth inverter by the second predetermined time;

a fifth inverter for inverting the output signal of the second delay unit;

a third NAND gate for performing a logic NAND operation to the output signal of the fourth inverter and the output signal of the fifth inverter; and a sixth inverter for inverting the output signal of the third NAND gate.

16. The semiconductor memory device as recited in claim 13, wherein the logic circuit is a NOR gate.

17. The semiconductor memory device as recited in claim 12, wherein the normal driving control signal generator includes:

a seventh and an eighth inverters for delaying the second enable signal;

a ninth inverter for inverting the overdriving control signal;

a fourth NAND gate for performing a logic NAND operation to the output signal of the eighth inverter and the output signal of the ninth inverter; and a tenth inverter for outputting the normal driving control signal by inverting the output signal of the fourth NAND gate.

18. The semiconductor memory device as recited in claim 11, wherein the BLSA power line driver includes:

a first PMOS transistor for driving a core voltage to a BLSA power line in response to a normal driving control signal;

a second PMOS transistor for driving an external voltage to the BLSA power line in response to an overdriving control signal;

a first NMOS transistor for driving a ground voltage to another BLSA power line in response to a normal voltage driving signal; and a second NMOS transistor for keeping the BLSA power lines be in a same voltage level in response to an equalizing signal.

19. The semiconductor memory device as recited in claim 10, wherein the active command is faster activated than the precharge command.

* * * * *